United States Patent [19]

Polhemus

[11] Patent Number: 4,847,672
[45] Date of Patent: Jul. 11, 1989

[54] INTEGRATED CIRCUIT DIE WITH RESISTIVE SUBSTRATE ISOLATION OF MULTIPLE CIRCUITS

[75] Inventor: Gary D. Polhemus, Limerick, Me.

[73] Assignee: Fairchild Semiconductor Corporation, Santa Clara, Calif.

[21] Appl. No.: 162,049

[22] Filed: Feb. 29, 1988

[51] Int. Cl.$^4$ .................. H01L 27/02; H01L 29/34
[52] U.S. Cl. ........................... 357/47; 357/51; 357/52
[58] Field of Search ...................... 357/47, 51, 52

[56] References Cited

U.S. PATENT DOCUMENTS

| | | | |
|---|---|---|---|
| 3,688,132 | 8/1972 | Gill et al. | 357/47 |
| 4,298,881 | 11/1981 | Sakurada | 357/52 |
| 4,321,616 | 3/1982 | Bise | 357/52 |
| 4,498,227 | 2/1985 | Howell et al. | 357/50 |

Primary Examiner—Eugene R. LaRoche
Assistant Examiner—Michael B. Shingleton
Attorney, Agent, or Firm—Lee Patch; Mark A. Aaker; Daniel H. Kane, Jr.

[57] ABSTRACT

An improved integrated circuit die with multiple circuits on the same substrate of semiconductor material is formed with circuit elements of the multiple circuits grouped respectively into at least first and second circuit areas or sections of the die. The first and second circuit sections of the die are separated and spaced from each other by a moat or separating boundary line. The separating boundary line is formed using appropriate mask lines on the fabrication masks. The separating boundary line is composed of the substrate semiconductor material between the circuit sections. The separating boundary line is formed without implanting buried collector layers or channel stop regions in the substrate semiconductor material of the boundary line width and depth. Relatively high resistive substrate isolation of the circuit sections of the die reduces feed through coupling of AC signal between circuit elements of the respective circuit sections. Separate substrate taps are provided for each circuit section fo the die and separate substrate tap leads are provided to each circuit section.

21 Claims, 2 Drawing Sheets

INTEGRATED CIRCUIT DIE WITH RESISTIVE SUBSTRATE ISOLATION OF MULTIPLE CIRCUITS

TECHNICAL FIELD

This invention relates to an improved bipolar integrated circuit die or chip layout and fabrication for resistive substrate isolation of alternating current signals between multiple circuits on the same substrate. The invention is applicable for example for reducing feed through coupling of AC signal switching noise between digital circuit elements and analog circuit elements on the same substrate. The invention is particularly useful where a high speed digital circuit is combined with a wideband analog circuit.

BACKGROUND ART

In the layout and fabrication of bipolar integrated circuits, a thin silicon epitaxial layer formed on a silicon substrate is subdivided into electrically isolated islands by a grid of oxidized regions of epitaxial silicon referred to as oxidized isolation regions, isolation oxide regions, or field oxide regions. The now classic method of oxide isolation of epitaxial islands is described by Douglas L. Peltzer in U.S. Pat. No. 3,648,125. The annular shaped isolation oxide regions defining and separating the epitaxial islands extend through the epitaxial layer to the laterally extending PN Junction between the epitaxial layer and substrate.

Active and passive integrated circuit structures or circuit elements such as transistors, diodes, and resistors are then formed in the epitaxial islands by a sequence of masking and implanting steps selectively introducing P type and N type dopant materials into different regions of the epitaxial islands. Typically, a buried layer composed of N+ silicon semiconductor material is formed in a P type substrate below the epitaxial island, underlying the circuit elements of the epitaxial island. The plus sign "+" indicates the higher density or higher concentration implant of buried layer N type impurity resulting in greater conductivity. The buried layers provide buried collector layers for transistors and are joined to the transistor collector taps by collector sink regions, for example as described in the Paul J. Howell, et al. U.S. Pat. No. 4,498,227. Channel stop regions, for example of P+ concentration silicon or semiconductor material, are formed below the isolation oxide between epitaxial islands and between buried collector layers to avoid or reduce parasitic metal oxide silicon (MOS) field effect transistor (FET) effects between epitaxial islands. Such use of channel stop regions is further described for example in the Donald J. Desbiens et al. U.S. Pat. Application Ser. No. 940,573 filed Dec. 11, 1986 entitled "Enhanced Density Modified Isoplanar Process."

A disadvantage of the conventional layout of integrated circuit elements with buried collector layers and channel stop regions is the problem of feed through of AC signals between circuit elements. NPN transistor elements of the epitaxial islands are capacitively coupled to the substrate through the buried collector layers. Channel stop regions provide low resistance paths through the substrate between the capacitively coupled transistor buried layer regions. Because of the integrated circuit package lead inductance and inductive impedance, there is insufficient return of AC signal noise through the substrate taps and leads, and high frequency substrate currents can follow the relatively low resistance channel stop path between circuit elements as an alternate return path. The problem is increased in digital to analog converters (DAC's) containing high speed switching digital circuits as well as wideband analog circuits on the same substrate. High frequency switching noise from the digital transistors is capacitively coupled from the buried collector layers to the relatively low resistance channel stop region substrate paths and is superimposed on sensitive analog circuit nodes.

A conventional approach to reduceing feed through coupling of high frequency switching noise is to provide abundant spacing between the NPN buried collector layers and the channel stop regions. The increased spacing and higher resistance of intermediate substrate material reduces the capacitive feed through coupling or loading but at the expense of increased and excessive layout size. Integrated component spacing and integrated circuit size cannot be minimized thereby losing the benefits of the minimum spacing otherwise permitted by oxide isolation of the epitaxial islands.

Another conventional method of reducing or eliminating high frequency AC signal noise is to filter out the switching noise using filters incorporated in the analog circuits. Flipflop digital circuits may have switching frequencies for example in the range of hundreds f megahertz, and risetimes less than 300pS. In the case of a wideband output analog circuit, the switching speed noise may be within the bandwidth of the wideband analog circuit output. The bandwidth must be preserved and such filtering is therefore inapplicable or inappropriate.

OBJECTS OF THE INVENTION

It is therefore an object of the present invention to provide a new bipolar integrated circuit die layout and construction which minimizes spacing of circuit elements while still avoiding or reducing feed through coupling of AC signals or high frequency switching noise between multiple circuits or multiple circuit sections of the same substrate.

Another object of the invention is to provide a new bipolar integrated circuit layout and fabrication which minimizes or avoids feed through coupling of AC switching noise between digital and analog circuits such as, for example in integrated circuit digital to analog converters, while reducing need for filters in the analog circuit.

A further object of the invention is to provide a novel integrated circuit die layout and construction which reduces feed through coupling of high frequency noise between high speed switching digital circuit elements and wideband analog circuit elements on the same substrate.

DISCLOSURE OF THE INVENTION

In order to accomplish these results the present invention provides an improved method of laying out and fabricating an integrated circuit die having multiple circuits on the same substrate of semiconductor material. The steps of the new method include grouping the circuit elements of the multiple circuits respectively into at least first and second circuit areas or sections of the die and spacing and separating the first and second circuit sections of the die from each other by a moat or separating boundary line. The separating boundary line is an elongate three dimensional region or moat having width and depth and comprises the substrate semiconductor material between the circuit areas or sections. A further step of the new method includes fabricating the die without buried collector layers or channel stop regions in the substrate semiconductor material of the separating boundary line for relatively high resistive substrate isolation between the circuit areas or sections of the die. The separating boundary line is therefore composed of semiconductor material of relatively higher resistivity than the buried layers or channel stop regions thereby reducing feed through coupling of AC signals between circuit elements of the respective circuit sections. In other words, the separating boundary line is composed of high resistivity substrate semiconductor material characterized by the absence of buried collector layers or channel stop regions which would lower the resistivity of the separating boundary line.

According to the invention spacing and separating the circuit areas or sections is accomplished by forming a mask line between the circuit sections on a channel stop mask for excluding channel stop region implants inthe separting boundary line width during fabrication of the integrated circuit die. Similarly a mask line is formed between the respective circuit sections on the buried collector layer mask for excluding buried collector layer implants in the separating boundary line width during earlier steps in the fabrication of the integrated circuit chips.

Typically the mask line width is in the range of approximately one to three mils for producing the separating boundary line width in the range of approximately 1-2 mils in the integrated circuit die layout. Such dimensions are suitable for example for an eight bit DAC. The boundary line width is typically in the order of approximately 1% or in the range of approximately 0.5% to 1.5% of the die width. The boundary line depth extends into the substrate a distance of, for example, at least 1$\mu$. Separate substrate contacts are provided for each of the respective circuit sections for coupling separate substrate contact leads to the respective circuit sections.

The resulting integrated circuit die is therefore composed of multiple circuit areas or sections of the die on the same substrate, separated and spaced from each other by the moat or separating boundary line. The separating boundary line is are formed without buried collector layers or channel stop regions in the substrate semiconductor material which forms the boundary line. The separating boundary line generally includes the field oxide layer formed within the volume of the moat overlying the substrate where buried collector layers and channel stop regions are excluded by the fabrication masks. The field oxide meets the substrate within the limits of the boundary line.

A feature of the invention is that the resistivity of the substrate semiconductor material of the boundary line separating the circuit sections is at least approximately ten times greater or an order of magnitude greater than the resistivity of the channel stop regions within the respective circuit sections which might otherwise provide relatively low resistance paths for feed through of capacitively coupled AC signal noise. This factor increase in resistivity in the separating boundary line affords resistive substrate isolation of the circuit sections.

The ratio of sheet or lateral surface resistivity of the substrate semiconductor material in the separating boundary line width to the sheet resistivity of channel stop regions within the respective circuit areas or sections is preferably in the range of 1000/100 to 6000/60, or more. Each of the numbers in the numerator and denominator represents a measure of sheet preferred increase in resistivity is therefore in the range of 10 to 100 times or one to two orders of magnitude greater, or more. This increase in the resistance of the feed through coupling paths of the substrate reduces feed through coupling of AC signals and high frequency switching noise in favor of return of such high frequency substrate currents through the inductive impedance of the package leads.

In the sequence of masking and implanting steps during fabrication, the invention excludes the implanting of buried collector layers or subcollector layers and channel stop regions within the area of the separating boundary line width using mask lines on the respective fabricating masks. Isolation oxide at these locations is formed over the substrate because the isolation oxide is generally formed wherever the buried collector layers and channel stop regions are not formed. Other features and advantages of the invention are set forth in the following specification and accompanying drawings.

DECRIPTION OF PREFERRED EXAMPLE EMBODIMENTS AND BEST MODE OF THE INVENTION

Figure 1:
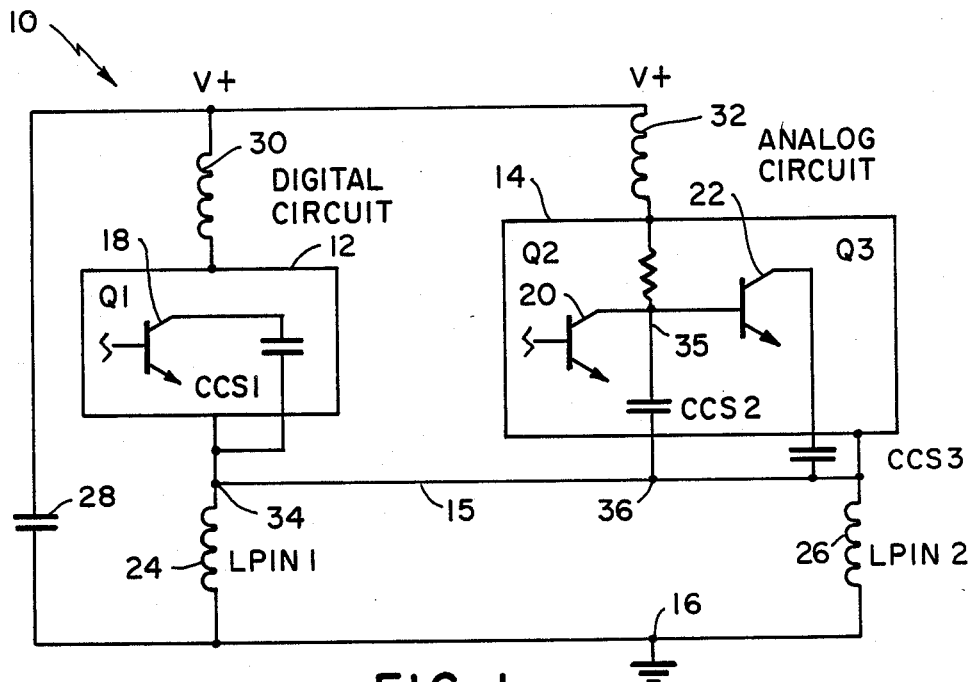
FIG. 1 is a fragmentary equivalent schematic circuit diagram of a portion of a prior art DAV integrated circuit die containing a digital circuit and an analog circuit on the same substrate.

A fragmentary equivalent schematic circuit diagram of a portion of a prior art DAC integrated circuit die is illustrated in FIG. 1. The equivalent circuit 10 depicts a portion of the die containing a digital circuit 12 and analog circuit 14 on the same common substrate 15 with a grounded substrate ground plane 16. The digital circuit 12 includes a digital transistor device Q1 such as an NPN digital switching transistor having a collector 18 capacitively coupled from the collector sink region and underlying buried collector layer or subcollector layer to the substrate 15. This capacitive coupling to the substrate is represented by capacitor CCS1. The analog circuit 14 such as an operational amplifier includes analog transistor devices or transistor circuit elements Q2 and Q3, for example NPN transistors having collectors 20 and 22 respectively. These collectors are similarly capacitively coupled from collector sink regions and buried collector layers to the substrate 15. The capacitive couplings to the substrate are represented respectively by capacitors CCS2 and CCS3.

A common low impedance ground plane 16 is provided and substrate contacts and ground leads LPIN1 and LPIN2 couple the substrates adjacent to the respective circuits 12 and 14 to the ground coupling 16. Ground leads and lead pins of the integrated circuit package exhibit a finite significant inductance and inductive reactance or impedance represented by coils 24 and 26 respectively. While direct current and low frequency noise may find a route to ground 16 through the ground lead and lead pins LPIN1 and LPIN2, the lead inductance represented by coils 24 and 26 exhibit a substantial impedance to high frequency AC signal noise including high speed switching noise from the digital transistor Q1. The impedance of the package leads LPIN1 and LPIN2 prevent proper return of high frequency substrate current noise through the power supply decoupling capacitor 28 coupled to the positive power supply terminal designated V+. The positive power supply leads also present finite inductive impedance represented by coils 30 and 32.

As a result of the conventional layout and arrangement, the substrate path 15, which may include the relatively low resistivity and relatively high conductivity channel stop region composed for example of P+ silicon, affords a relatively low resistance path for AC signal noise such as high frequency switching noise between the circuits. For example high frequency switching noise coupled to the digital circuit substrate node 34 by way of capacitive coupling CCS1 generates substrate currents which follow a preferred route through the relatively low resistance substrate path 15 to the sensitive analog circuit node 35 via the analog circuit substrate node 36 capacitively coupled to the analog transistors Q2 and Q3 through capacitive couplings CCS2 and CCS3.

Figure 2:
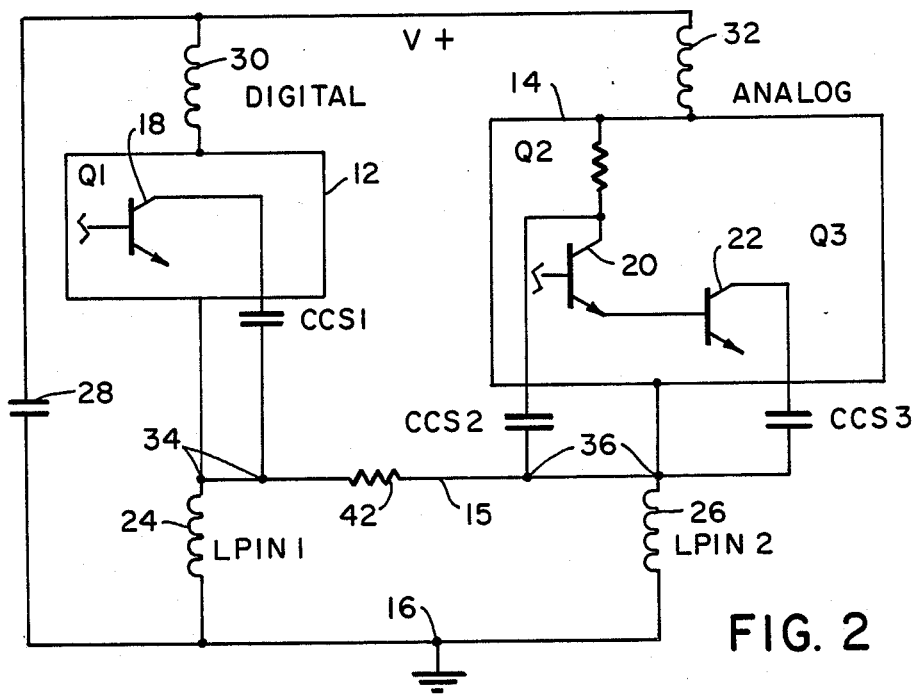
FIG. 2 is a fragmentary equivalent schematic circuit diagram of a portion of a DAV integrated circuit die showing a digital circuit section and an analog circuit section according to the present invention.

To avoid this problemlatic feed through coupling of high frequency noise the present invention provides a multicircuit integrated circuit die layout and construction represented by the fragmentary equivalent schematic circuit diagram of FIG. 2. In the schematic circuit diagram of FIG. 2 similar circuit elements and components are designated by the same reference numerals and designations as FIG. 1. In the equivalent schematic circuit diagram 40 according to the present invention illustrated in FIG. 2, the difference of the present invention from the circuit diagram of FIG. 1 is that the substrate path 15 is no longer a relatively low resistance substrate path in comparison with the ground lead and ground pin paths LPIN1 and LPIN2. According to the present invention a relatively high resistance substrate path 42 is arranged or structured between the digital circuit elements of digital circuit 12 on the one hand and the analog circuit elements of analog circuit 14 on the other hand. This is accomplished as hereafter fully described by assuring the presence of relatively high resistance substrate semiconductor material and field oxide between the respective circuits.

As shown in the plan view of the integrated circuit die 45 according to the present invention illustrated in FIG. 3 the high resistive substrate isolation of multiple circuits such as an analog circuit of analog circuit elements and a digital circuit composed of digital circuit elements is as follows. During layout of the integrated circuit and preparation of the integrated circuit fabrication masks, the analog circuit elements including the analog transistor devices etc. are grouped and segregated into a separate analog circuit region, area or section 46 of the die. Thus the analog circuit elements form a contiguous and segregated or grouped analog circuit section 46. The digital circuit elements including the digital transistor devices are similarly grouped and isolated into a second digital circuit region, area or section 48. Thus the digital circuit elements form a contiguous segregated or grouped digital circuit section 48.

The analog and digital circuit sections 46 and 48 are spaced and separated by a moat, isolation ring or separating boundary line 50. The separating boundary line 50 may typically have a width of for example one to two mils, in the case of an eight bit DAC integrated circuit die or chip, and a depth extending into or through the substrate material 60 a distance of, for example, at least 1$\mu$. The separating boundary line 50 represents a two dimensional area on the surface of the die in which buried collector layewr implants or subcollector layer implants and channel stop region implants have been excluded during wafer fabrication. It also represents a three dimensional region within the die composed of high resistance substrate material 60 and dielectric isolation oxide 72. Formation of the separating boundary line may be accomplished for example by the placement of appropriate mask lines on the wafer fabrication masks including the channel stop mask and the buried collector layer mask after separating, segregating and grouping the respective circuit elements. It is apparent that the phrase "mask line" is used in the specification and claims to denote an elongate two dimensional area of specified width on a mask. On a die or die product, or within the die itself, the "separating boundary line" or "moat" denotes an elongate three dimensional region with width and depth resistively isolating the separate circuit sections.

In fabrication of the integrated circuit wafer dies, the buried collector implants are excluded from the isolation ring 50 by an appropriate mask line. The subsequent channel stop region implant which normally goes everywhere where there is not a buried layer is similarly excluded from the separating boundary line 50 by further appropriately placed mask lines. The field oxide or isolation oxide is then thermally grown wherever there are no buried layers and no channel stop regions. The width and depth of the separating boundary line 50 is therefore generally composed of underlying substrate comprising the original low resistivity semiconductor material and overlying field oxide.

Figure 3:
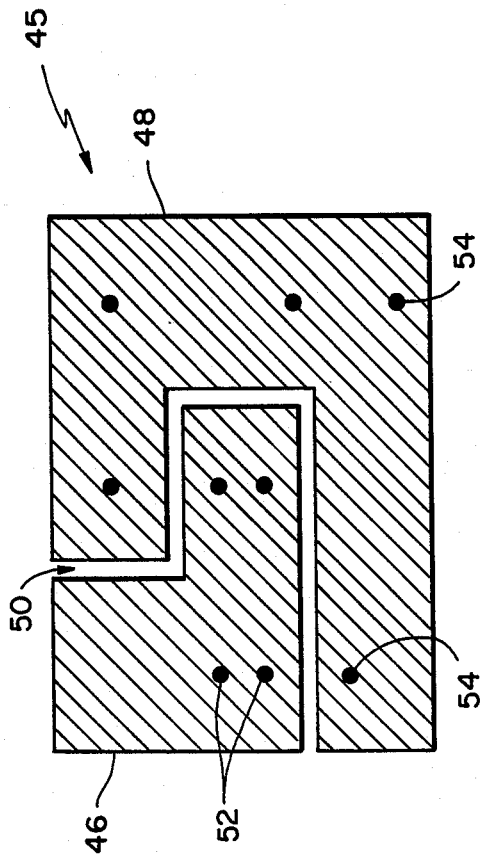
FIG. 3 is a diagrammatic plan view of the DAV integrated circuit die according to the invention showing a moat or separating boundary line spacing and separating the analog circuit section containing analog circuit elements from the digital circuit section containing digital circuit elements.

A typical eight bit DAV integrated circuit die as illustrated in FIG. 3 has a die dimension approximately 133 mills wide by 113 mils high. The moat width in the range of approximately one to two mils therefore represents in the order of approximately one percent of a side dimension of the die. It has been found that any increase in the overall die dimensions or die size which results from the segregated layout and separating boundary line width is insignificant. Outside of the separating boundary line 50 minimum spacing may be incorporated in the layout of the respective circuit elements of the segregated multiple circuits. The depth of the separating boundary line or moat in the substrate is at least the depth of channel stop regions, e.g. at least 1$\mu$ extending into the original high resistivity substrate material free of later implants.

Each separated or segregated circuit section is provided with its own substrate contacts. For example analog circuit section substrate contacts 52 are provided in the analog circuit section 46 while digital circuit section substrate contacts 54 are provided in the digital circuit section 48. Separate package leads and pins may therefore be provided to the respective circuit sections for applying supply voltages etc.

Figure 4:
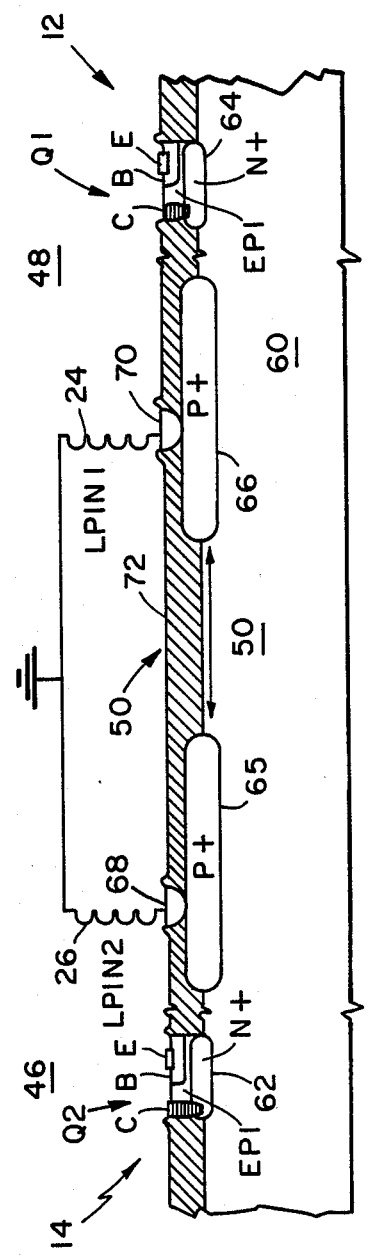
FIG. 4 is a fragmentary diagrammatic side cross section through a portion of the DAC integrated circuit die in the vicinity of the separating boundary line.

A detailed fragmentary side cross section through a portion of the integrated circuit die 45 of FIG. 3 across the separating boundary line 50 is illustrated in FIG. 4. The multicircuit integrated circuit structure is typically fabricated on a substrate 60 of high resistivity P— semiconductor material. The minus sign "—" indicates the low level of P type impurity concentration and therefore the relatively high resistivity of the substrate material. In the example of FIG. 4 an analog circuit element namely NPN analog transistor Q2, part of analog circuit 14 segregated or grouped into the analog section 46 is shown on the left side of the cross sectional view. A digital circuit element namely digital transistor Q1 part of a digital circuit 12 segregated and grouped into the digital section 48 is shown on the right hand side of the cross sectional view in FIG. 2. The analog circuit section 46 and the digital circuit section 48 are separated by the moat or separating boundary line 50 as heretofore described.

In fabrication of the integrated circuit die, N+ buried collector layers 62 and 64 are implanted through appropriate masking and implanting steps as described for example in the Howell et al. U.S. Pat. No. 4,498,227 and the Desbiens et at. U.S. Pat. Application Ser. No. 940,573 referred to above. The grouped and segregated analog circuit section 46 and digital circuit section 48 are separated on the masks by appropriate mask lines for example in the range of 1 to 3 mils wide and the composite of the mask lines ultimately forms the separating boundary line 50 as described. The buried collector layer 62 is associated with analog transistor Q2 while buried collector layer 64 is associated with digital transistor device Q1.

The P+ channel stop regions 65 and 66 associated respectively with the analog circuit section 46 and digital circuit section 48 are implanted in the substrate 60 according to channel stop masking and implanting steps as described for example in the cited references. Channel stop implanting is accomplished inthe segregated analog and digital circuit sections with a separating mask line in the range of 1 to 3 mils wide located on the channel stop region masks so that the composite mask lines form the moat or separating boundary line 50. The separating boundary line 50 with resulting width for example in the range of one to two mils on the die or die product is therefore initially established by excluding buried collector layers and channel stop regions within the area or width and depth of the separating boundary line 50. It is initially established by preserving the high resistivity P— substrate material throughout the width and depth of the separating boundary line 50.

The epitaxial layer is grown over the implanted substrate, and the epitaxial layer is subdivided into the electrically isolated epitaxial islands separated by the isolation oxide regions. The isolation oxide 72 is also formed in the width of the boundary line 50. Active and passive integrated circuit structures or circuit ellements such as transistors, diodes and resistors are formed in the epitaxial islands by a sequence of masking and implanting steps, all well known procedures as described in the cited references. In the example of FIG. 4 the analog transistor Q2 and digital transistor Q1 each include implanted collector, base, and emitter elements or regions designated C, B, and E respectively. The remaining original epitaxial silicon forming the epitaxial islands is designated EPI.

According to the invention separate substrate contacts 68 and 70 are extended respectively to the channel stop regions 65 and 66 providing separate substrate contacts and separate substrate contact leads LPIN2 and LPIN1 for the respective analog circuit section 46 and digital circuit section 48. According to the standard fabrication procedures the isolation oxide 72 separating the epitaxial islands extends over the moat portion or separating boundary line 50.

Throughout the fabrication process the relatively high resistance of the separating boundary line 50 is preserved. The moat, isolation ring or separating boundary line 50 is composed of the underlying high resistivity P— substrate silicon semiconductor material and the overlying dielectric field oxide 72. The starting P— silicon substrate material 60 generally has a volume resistivity in the range of approximately 8 to 15 ohm-centimeters ($\Omega$-cm) which may be expressed as a sheet resistivity or lateral surface resistivity in the range of for example 3000 to 6000 ohms per square ($\Omega$/sq). For example a typical volume resistivity of 10 ohm-centimeters ($\Omega$-cm) is equivalent to approximately 4000 ohms per square ($\Omega$/sq.). Actual sheet resistivity or lateral surface resistivity may actually be in the range of 1000 to 6000 ohms per square ($\Omega$/sq.) for the substrate material in the moat or separating boundary line. On the other hand the sheet resistivity or lateral surface resistivity of the P+ silicon channel stop regions may be in the range of for example 60 to 100 ohms per square ($\Omega$/sq.). Thus according to the present invention the ratio of the resistivity of the separating boundary line substrate material to the resistivity of the channel stop region material is in the range of 1000/100 to 6000/60 with the numerical values expressed in units of ohms per square. The present invention therefore increases the resistive isolation between the grouped or segregated multi circuit sections, in this example the analog circuit section 46 and digital circuit section 48, by a factor of 10 to 100 times greater than the coventional integrated circuit die layout and fabrication or 1 to 2 orders or magnitude greater.

By means of the layout arrangement and fabrication according to the present invention cross talk or feed through coupling of AC signal noise or high frequency switching noise is reduced for example from the conventional peak to peak feed through coupling noise between digital and analog circuits of 8 to 10 millivolts (mV) to as little as 1 to 2 mV. By the technique of resistive substrate isolation according to the present invention feed through coupling of noise is typically reduced by a factor of 2 to 4 times that of conventional multicircuit integrated circuit dies with a typical broad analog bandwidth. Because of the relatively high resistance to substrate currents presented by the substrate path across the separating boundary line 50, the inductive reactance or inductive impedance presented by the substrate leads LPIN2 and LPIN1 and represented by the coils 26 and 24 is relatively reduced in significance by the factor of 2 to 4.

The integrated circuit die layout and fabrication is applicable according to the invention for all multicircuit bipolar integrated circuits with multiple circuits on a single substrate, die, or die product. The separating boundary line which separates the multiple circuits according to the invention extends or runs at each end to the edge of the substrate, die or die product. In the case of a die or die product, the separating boundary line runs at each end to a scribe line or scribe lines that delineate and divide such die from other dice on a wafer. The separating boundary line depth free of later implants extends into or through the underlying high resistance substrate material. While the invention has been described with reference to particular example embodiments it is intended to cover all variations and equivalents within the scope of the following claims.

I claim:

1. An improved integrated circuit die having multiple circuits on the same substrate of relatively high resistivity semiconductor material, said multiple circuits each respectively comprising multiple circuit elements including transistor circuit elements having buried collector layers with capacitive coupling to the substrate, said transistor circuit elements being separated by isolation oxide regions with relatively low resistivity semiconductor material channel stop regions underlying the isolation oxide regions between transistor circuit elements to suppress parasitic MOS FET effects for DC isolation between transistor circuit elements, the improvement for AC isolation between the multiple circuits comprising:

said circuit elements of the multiple circuits being grouped respectively into at least first and second circuit sections of the die;

said first and second circuit sections of the die being separated and spaced from each other by a separating boundary line forming an elongate three dimensional egion or moat having width and depth and comprising the relatively high resistivity substrate semiconductor material between the circuit sections;

said separating boundary line bing formed without buried collector layers or channel stop regions in the relatively high resistivity substrate semiconductor material of the boundary line for relatively high resistive substrate isolation of the circuit sections of the die thereby reducing feed through coupling of AC signals from a transistor circuit element of one of the respective circuit sections to a transistor circuit element of another circuit section.

2. The integrated circuit die of claim 1 further comprising separate substrate taps for each circuit section of the die for separate substrate tap leads to each circuit section.

3. The integrated circuit die of claim 1 wherein the multiple circuits formed on the same substrate of semiconductor material comprise digital and analog circuit sections separated by the separating boundary line.

4. The integrated circuit die of claim 3 wherein the multiple circuits formed on the same substrate of semiconductor material comprise a high speed switching digital circuit section and a wideband analog circuit section separated by the separating boundary line.

5. The integrated circuit die of claim 1 wherein the resistivity of the substrate semiconductor material of the boundary line separating the circuit sections is approximately 10 to 100 times greater than the resistivity of channel stop regions within the respective circuit sections separated and spaced by the separating boundary line and wherein the substrate semiconductor material comprises relatively high resistivity p type semiconductor material.

6. The integrated circuit die of claim 1 wherein the width of the separating boundary line is approximately 1 to 2 mils and the depth is at least 1 $\mu$.

7. The integrated circuit structure of claim 5 wherein the ratio of sheet or surface resistivity of the substrate semiconductor material in the separating boundary line to the sheet or surface resistivity of channel stop regions within the respective circuit sections, with sheet resistivity expressed in units of ohms per square ($\Omega$/sq.) is approximately in the range of 1000/100 to 6000/60.

8. The integrated circuit die of claim 1 wherein the resistivity of the substrate semiconductor material in the separating boundary line is at least approximately 10 times greater than the resistivity of the channel stop regions within the respective circuit sectionns separated and spaced by the separating boundary line.

9. The integrated circuit die of claim 1 wherein the separating boundary line further comprises isolation oxide overlying the substrate semiconductor material comprising the separating boundary line.

10. An improved method of laying out and fabricating an integrated circuit die having multiple circuits on the same substrate of relatively high resistivity semiconductor material, said multiple circuits each comprising multiple circuit elements including transistor circuit elements having buried collector layers with capacitive coupling to the substrate said transistor circuit elements being separated by isolation oxide regions with relatively low resistivity semiconductor material channel stop regions underlying the isolation oxide regions between transistor circuit elements to suppress parasistic MOS FET effects for DC isolation between transistor circuit elements, the improved method for AC isolation between the multiple circuits comprising:

grouping the circuit elements of said multiple circuits respecitively into at least first and second circuit areas or sections of the die;

spacing and separating the first and second circuit sections of the die from each other by a moat or separating boundary line forming an elongate three dimenional region or moat having width and depth and comprising the relatively high resistivity substrate semiconductor material between the circuit areas or sections;

and the fabricating the die without buried collector layers or channel stop regions in the relatively high resistivity substrate semiconductor material of the separating boundary line for relatively high resistive substrate isolation between the circuit sections of the die separated by the separating boundary line thereby reducing feed-through coupling of AC signals from a transistor circuit element of one of the respective circuit sections to a transistor circuit element of another circuit section.

11. The method of claim 10 wherein the step of spacing and separating the circuit sections comprises forming a mask line between the circuit sections on a channel stop mask for excluding channel stop region implants in the separating boundary line during fabrication of the integrated circuit die.

12. The method of claim 11 wherein the step of spacing and separating the circuit sections comprises forming a mask line between the respective circuit sections on the buried collector layer mask for excluding buried collector layer implants in the separating boundary line during fabrication of the integrated circuit die.

13. The method of claim 11 wherein the mask line width is in the range of approximately 1 to 3 mils and the depth is at least 1 $\mu$.

14. The method of claim 10 wherein the step of fabricating the die comprises forming separate substrate contacts for each of the respective circuit sections for coupling separate substrate contact leads to the respective circuit sections.

15. The method of claim 14 wherein the width of the separating boundary line is approximately 1% of the side dimension width of the die.

16. The method of claim 10 wherein the step of fabricating the integrated circuit die without buried collector layers or channel stop regions provides a separating boundary line of substrate semiconductor material having resistivity at least approximately 10 times greater than the resistivity of channel stop regions within the respective circuit sections separated and spaced by the separating boundary line.

17. The method of claim 16 wherein the resistivity of the separating boundary line substrate semiconductor material is in the range of approximately 10 to 100 times the resistivity of said channel stop regions and wherein the substrate semiconductor material comprises relatively high resistivity p type semiconductor material.

18. The method of claim 17 wherein the ratio of the sheet or surface resistivities of the separating boundary line substrate semiconductor material to said channel stop regions with sheet resistivities expressed in units of ohms per square ($\Omega$/sq.) is approximately in the range of 1000/100 to 6000/60.

19. The method of claim 10 wherein the multiple circuits comprise analog and digital circuit sections separated by the separating boundary line.

20. The method of claim 19 wherein the digital circuit section comprises a high speed switching digital circuit section and the analog circuit section comprises a wide band analog circuit section separated by the separating boundary line.

21. The method of claim 10 further comprising the step of forming isolation oxide overlying the substrate semiconductor material comprising the separating boundary line.

\* \* \* \* \*